United States Patent [19]

Belbel et al.

[11] Patent Number: 4,763,220

[45] Date of Patent: Aug. 9, 1988

[54] STATIC SWITCH CIRCUIT OR DEVICE FOR THE PROTECTED SUPPLY OF A LOAD, AND ITS LINE

[75] Inventors: Elie Belbel, Epinay sur Seine; Louis Fechant, Le Vesinet; Jaan Paul Riotte, Epinay sur Seine, all of France

[73] Assignee: La Telemecanique Electrique, France

[21] Appl. No.: 22,449

[22] PCT Filed: Jun. 3, 1986

[86] PCT No.: PCT/FR86/00188

§ 371 Date: Feb. 3, 1987

§ 102(e) Date: Feb. 3, 1987

[87] PCT Pub. No.: WO86/07510

PCT Pub. Date: Dec. 18, 1986

[30] Foreign Application Priority Data

Jun. 4, 1985 [FR] France ................. 85 08381

[51] Int. Cl.[4] .............................................. H02H 3/08
[52] U.S. Cl. ......................................... 361/93; 361/58; 361/91; 361/100
[58] Field of Search ................. 361/5, 6, 8, 13, 58, 361/91, 100, 93, 94, 95, 96, 2, 3; 307/632, 633, 134, 135, 137

[56] References Cited

U.S. PATENT DOCUMENTS

| | | | |
|---|---|---|---|
| 4,275,430 | 6/1981 | Seki et al. | 361/58 X |
| 4,351,014 | 9/1982 | Schofield, Jr. | 361/100 |
| 4,377,835 | 3/1983 | Asplund et al. | 361/91 |
| 4,475,139 | 10/1984 | Chadwick | 361/91 |
| 4,651,251 | 3/1987 | Thiele | 361/91 X |

FOREIGN PATENT DOCUMENTS

| | | |
|---|---|---|
| 10882 | 5/1980 | European Pat. Off. . |
| 82493 | 6/1983 | European Pat. Off. . |
| 2637868 | 7/1977 | Fed. Rep. of Germany . |
| 3238899 | 4/1984 | Fed. Rep. of Germany . |
| 1181853 | 2/1970 | United Kingdom . |

OTHER PUBLICATIONS

IEEE paper # vol. PAS-105, No. 5, May 1983, "Development of Zinc Oxide Ceramic Energy Absorbers for DC Thyristor C. B."
Siemens Components XIX (1984) No. 6, "Capacitors for GTO Thyristors" by Goldbrunner et al.

Primary Examiner—G. P. Tolin
Assistant Examiner—Derek S. Jennings
Attorney, Agent, or Firm—William A. Drucker

[57] ABSTRACT

Each phase circuit comprises a static switch of the IGT or GTO type, between the anode and the cathode of which there is arranged in parallel a series mounting of a CTP resistance and of a normally open switch which is closed when a current detector detects a short abnormal intensity lower than six times the rated current; said static switch is locked either immediately when the rate is higher than six, or with a short delay on the contrary. Said device is particularly convenient to be used in industrial installations where it is desired to replace the associations of contactors, thermal relay and circuit breaker by static apparatuses.

8 Claims, 5 Drawing Sheets

STATIC SWITCH CIRCUIT OR DEVICE FOR THE PROTECTED SUPPLY OF A LOAD, AND ITS LINE

The invention relates to an electric switch device having between two input and output terminals, a semiconductor component adapted for establishing and interrupting the passage of current between these terminals when an electrode controlling this component receives appropriate signals which are delivered by a control device receiving, on the one hand, conduction or interruption orders corresponding to normal operation and, on the other hand, disabling orders which are emitted when the intensity of the current which is measured by detection means placed in series between these terminals, undergoes an abnormal rise.

A circuit, having an operation comparable to that defined above and which is known from the patent application DE-OS No. 2 416 450 uses a semiconductor component of the triac type for feeding in regulated fashion a load having a resistive characteristic, similar to that of an incandescent lamp.

Such a load has then possible resistance variations, which are known beforehand and which are stabilized in a time close to a period; the circuit, in which it is placed, which is generally fed by a domestic mains consequently sees currents passing whose short circuit intensity can never take on excessive values; furthermore, the use of a triac as switch member has here the disadvantage of not allowing interruption of the AC current at any time in the period.

Such a device consequently does not take into account transitory phenomena such as those which appear in the power supply circuits for motors where overloads, of the order of 5 to 6 times the nominal current, may occur during a current drain which may last for about a second.

The invention relates to an industrial switch device or circuit in which the load is formed by an electric motor whose consumption may vary over a large range of values related to the nature of the masses which are to be set in motion; in such an industrial circuit, which is generally fed by the very low impedance network, the line, the switch member and the load should be protected against the effects of current overloads and against those of true short circuits which may either damage the load definitively, or cause destruction of the switch member resulting in a prolonged stoppage of production; in addition, bringing the load into service with this switch member corresponds to a category of use whose constraints are much more severe than those governing domestic apparatus.

The most widely used technique at the present time for effecting the above mentioned functions, uses an association of electromechanical products such as contact makers, thermal protection relays, contact breakers, limiters and fuses whose particular properties must be well chosen if these functions are to be perfectly fulfilled.

The invention consequently proposes providing a static industrial switch device or circuit which is capable of frequently both establishing and interrupting electronically the power supply of a load, whose impedance may vary accidently and of protecting this load and the line against the effects of current surges and short circuits.

According to the invention, the aim sought is attained because, in a conducting branch placed in parallel across the anode and the cathode of this component which belongs to one of the so called GTO families, respectively IGT and GTR, there are placed in parallel:

a—a resistor or varistor adapted for limiting the voltage between this anode and this cathode and for reversibly withstanding a high energy pulse, b—a series circuit including a current limiting resistor adapted for withstanding a high current pulse and contacts of a non repulsive mechanical switch, which is normally open, and whose closure may be provided by a high speed relay, the coil of this relay being supplied with power only when a first type of fault of limited duration appears, for which the presumed current is substantially between 1.25 times and 6 times the nominal current, and before a disabling signal is transmitted to the control electrode of the static switch, whereas this coil is not supplied with power and a permanent disabling signal is immediately delivered to this electrode when a current gradient appears greater than about 6 times the nominal current gradient signalling the appearance of a second type of fault.

It is also known that controlled semiconductor electric components, such as the GTOs (gate turn off), the IGTs (Isolated Gate Transistor) or the GTR$_s$ (giant transistor) having the properties of being able to be disabled at any moment during the AC current period, at the present time undergo progressive improvements of their isolating, intensity and re-establishment time characteristics favorable to the industrial use of their own function.

Such a use however requires measures to be taken adapted to the particular nature of the phenomena which appear in the corresponding installations, particularly in the case of overloads which may have a repetitive character.

The invention will be better understood from reading the following description and from examining the accompanying drawings where:

Figure 1:
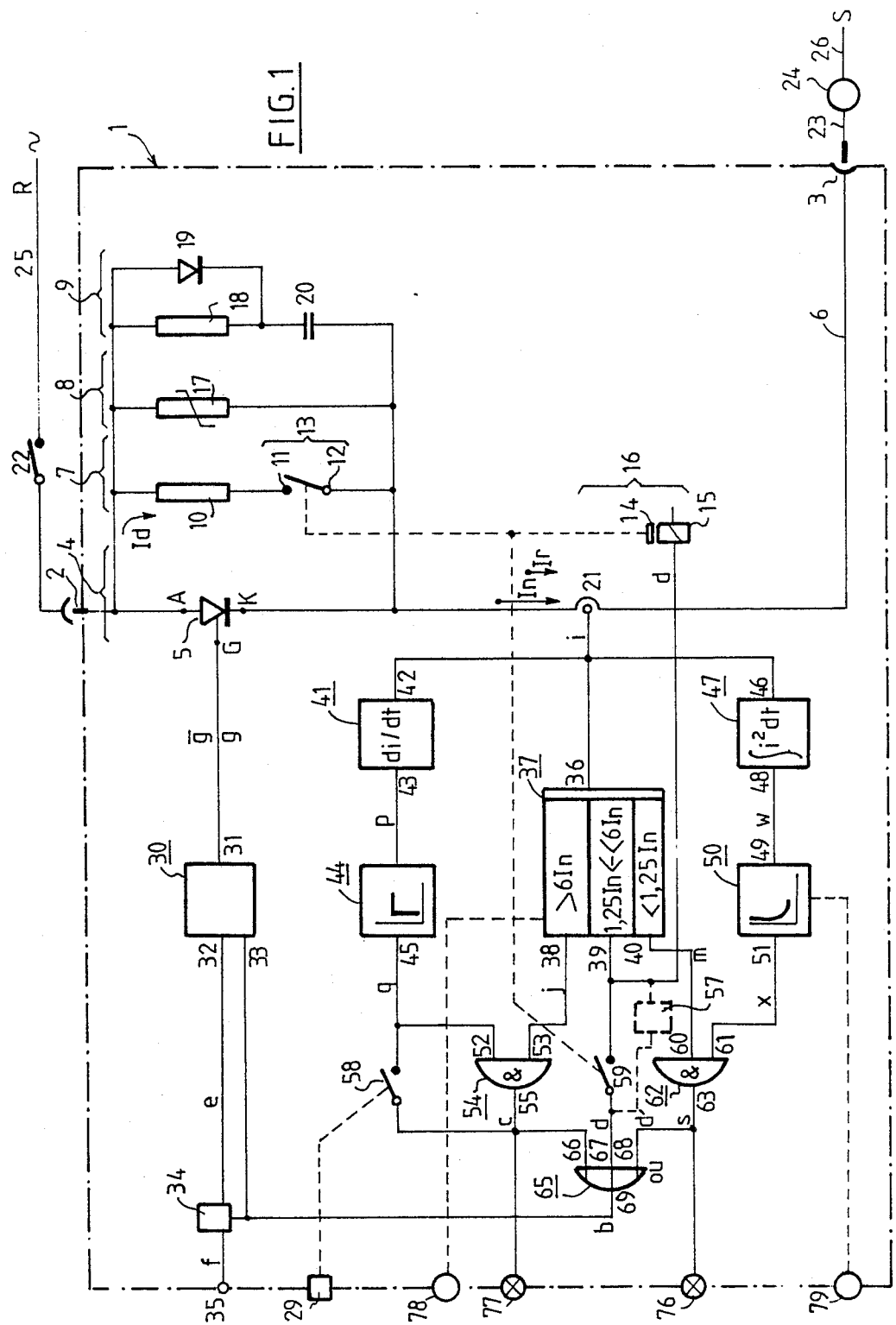
FIG. 1 shows schematically the circuits and functions which are mainly used in a device of the invention.

The static switch device 1 shown in FIG. 1 includes a current input terminal 2 adapted for connection to a phase R of an AC network including, for example, a switch 22 for disconnecting the line 25 and an output terminal 3 adapted for connection by a conductor 23 to a load such as motor 24, and by a line 26 to another phase S.

In a main current branch 4 going from one terminal to the other is disposed a controlled electronic switch component 5 which may be of the GTO, GTR or IGT type. The representation chosen in FIG. 1 concerns a GTO having an anode A, a cathode K and a control gate G. It is known that such an electronic switch is enabled, when its anode is at a positive potential, only if a positive pulse is applied to its gate, and only assumes its disabled state if a negative pulse is subsequently applied to this gate; such a type of switch is therefore interesting to the extent that it may be disabled at any time during a positive AC current half period.

The main branch also includes means 21 for protecting the intensity of the current which flows through it. These means may be of the current transformer type or be formed by a low value resistor at the terminals of which the potential drop represents an image of the current.

In a bypass branch 8, which is placed in parallel across the anode and the cathode, are disposed in parallel, on the one hand, a voltage limiting resistor 17 formed preferably from a material such as ZnO, or a semiconductor circuit using Zener diodes and of a voltage ranging from 600 V to 1000 V and, on the other hand, a series circuit placed in a parallel branch 7 and including:

a resistor 10 formed preferably by means of a conducting organic polymer, and a mechanical switch 13 having contacts 11 and 12.

Figure 3:
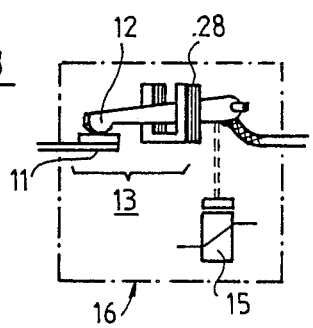
FIG. 3 illustrates a preferred embodiment of a mechanical switch used in FIG. 1.

The mobile contact 12 of this switch is connected to a plate or core 14, of an electromagnet or high speed relay 16 having an energization coil 15. Means, such as a magnetizable structure 28, will be advantageously associated with the mobile contact 12, so as to prevent the effects of an electro-dynamic repulsion appearing when high currents flow, see FIG. 3.

Bypass branch 19 also placed in parallel includes a circuit for protection against the voltage gradients which would risk damaging the static switch 5.

Such a circuit includes here a capacitor 20 placed in series with a parallel circuit of a resistor 18 and a diode 19 biased in the same direction as that of the static switch.

An electronic control circuit 30, which is fed by a DC current source not shown in this Figure includes a first control input 32 which is connected to an external control terminal 35 adapted for receiving external signals -f- for activating or stopping the switch device 5; a second input 33 of circuit 30 is intended to receive a disabling signal -b- for causing conduction of the switch device 5 to stop; finally, an output 31 of circuit 30 is connected to the gate -G- of the switch device 5 for communicating thereto control signals g and $\bar{g}$ adapted for enabling or disabling this switch.

Under conditions of normal operation of device 1, in which the main branch 4 will have have the nominal current in flowing therethrough, because of the absence of faults on line 23, 26 or in load 24, switch 13 is open and the presence of a signal -f- or -$\bar{f}$- at terminal 35 causes the appearance of a signal -g- or -$\bar{g}$- for enabling or disabling the switch 5.

Normal operating conditions result from the fact that the current detector 21 measures a current between the limits of what is designated by the nominal current In.

When the current flowing in branch 4 departs from these limits, the operating conditions are no longer normal.

We will be concerned first of all only with situations in which the measured current is either between a value close to 1.25 In and about six times In, or higher than about six times In.

In the first case, the abnormal level of the current may be generally attributed to a difficulty in starting up the load or to an unforeseen slowing down if it is a question of the motor.

In the second case, the excessive level of the current may be attributed either to the presence of a true short circuit in line 23, 26 or to the appearance of an impeding short circuit resulting from mechanical locking of the motor 24.

A signal -i-, which is an analog image of the current measured by detector 21, is applied simultaneously to the input 42 of a first circuit 41 which makes a derivation di/dt, to the input 46 of a second circuit 47 which effects an integration of a power of -i- which is close to $i^2$, namely $\int i^2 dt$, and to the input of a circuit 37 which effects a discrimination of three possible current values included either between In and about 1.25 In, or betwen 1.25 In and 6 In, or else of values greater than 6 In.

The levels of the signals -p- present at the output 43 of circuit 41 which is representative of the growth of the current at any time during a half period, is analysed by a threshold detector circuit 44 which delivers at its output 45 a signal -q- when the current gradient is greater than a threshold six times the nominal current gradient.

By nominal current In is meant for example the peak value of a nominal current half wave, whereas the nominal current gradient may be defined by the slope P of growth of this nominal current in the vicinity of the current zero.

The discriminator circuit emits at one of the three outputs 38, 39, 40 one of the three corresponding signals -j-, -d-, -m-.

The output signals -j- and -q- are applied to the inputs 52, 53 of an AND gate 54, which, when there is simultaneity of the signals, emits a signal -c-, which is fed to one of the inputs 66 of an OR gate 65 adapted for emitting the disabling signal -b-.

A means, shown schematically by a switch 58, allows the AND gate to be dispensed with, as required, so that the emission of a signal -c- appears when only the signal -q- is present; the advantage of this arrangement will be clear subsequently.

The output signal -d- is fed on the one hand to the input 67 of the OR gate 65 and, on the other hand to the coil 15 of the electromagnet 16. It will be seen subsequently that a switch 59 or a delay circuit 57 could be placed between the output 39 and the input 67.

In the schematical circuit shown in FIG. 1, nothing indicates whether the appearance of a signal -d- will cause first of all the appearance of the signal -$\bar{g}$- or the closure of switch 13. Measures, such as the incorporation of a delay circuit (not shown) between the point -h- and the input 67 are taken so that switch 13 is closed before the signal -$\bar{g}$- is produced; as a variant, the palette or the core 14 may have the function of simultaneous closure of an auxiliary switch such as 59 which is normally open and closes after switch 13.

Figure 2:
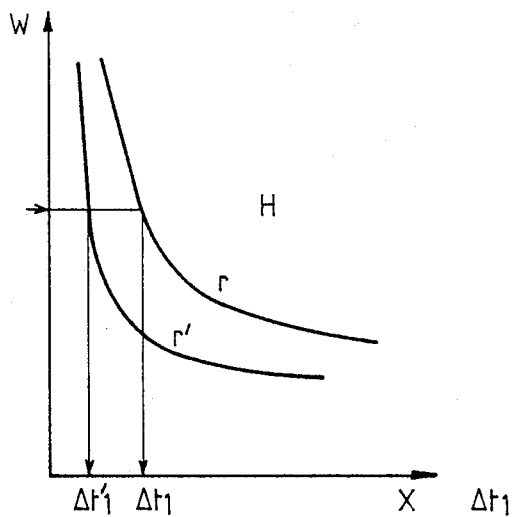
FIG. 2 shows the trend of a particular function elaborated by one of the circuits of FIG. 1.

The switches -W-, coming from the integrator circuit 47, which represent at all times the energy consumed by the load during a preceding time interval of given value, are applied to the input 49 of a delay circuit with pseudo-hyperbolic characteristic 50 whose output 51 emits a signal -x- after a time interval Δt whose extent increases in the reverse direction of the level of signal W, see FIG. 2.

This signal -x- and the signal -m- are applied to an AND gate 62 whose output 63 emits, when they are present, a signal -s- which is applied to a third input 68 of the OR gate 65.

When a moderate current overload appears between $I_n$ and 1.25 $I_n$, but of extended duration, the discriminator 37 emits a signal -m- and the signal W representing the integral $\int i^2 dt$ is transmitted to the delay stage 50; when this latter emits a signal -x-, after an inverse time interval, the two inputs of the AND gate 62 are occupied by signals and an extended overload signal -s- is transmitted to the Or gate 65 whose output sends a disabling signal -b- to the control circuit 30.

When a current overload appears between about 1.25 times and six times the nominal current $I_n$ and of short duration, the signal -d- emitted by the discriminator 37 is not accompanied by the appearance of the signal -x-, for the integral $\int i^2 dt$ is too small, but this signal is applied without delay to the high speed relay 16 whose energization causes closure of the switch 13 and thus allows a high shunt current $I_d$ to flow in branch 7 through resistor 10; the property of this resistor of reversibly withstanding current overloads of short duration allows the static switch to be relieved of an appreciable fraction of the current which would have flowed through it. Furthermore, the increase in the ohmic resistance of this resistor causes an appreciable reduction of the shunt current in branch 7.

The duration of such an overload can however not exceed a value which may be determined by an adjustable delay stage 57 to which the signal -d- is communicated. When this duration is greater than a value chosen as a function of the nominal current, of the nature of the load, of its thermal properties and of its function (for example starting up a motor), a signal -d'- which is emitted by this stage 57 is fed to the input 67 of the OR gate 65 which causes a disabling signal -p- to appear and transmits it to the control circuit 30.

When the static switch 5 is disabled, the detector 21 then only detects the flow of a residual current $I_r$ which is not sufficiently high for a signal -d- to appear at the output 39; since the electromagnet 16 is no longer supplied with power, the switch 13 opens, interrupting the small current going towards the load.

If, during the more extended operating period of stage 50, a short circuit current detected by detector 21 develops between terminals 2, 3 of the device, the two preceding operating modes are supplanted by a third operating mode using either simultaneously the instantaneous intensity of the current and the value of its growth, or separately the growth when switch 58 has been previously closed.

In this third operating mode which may also develop without one of the two preceding ones having previously appeared, a signal -p- representing the derivative of the current elaborated in the shunt circuit 41, is applied to the threshold detector 44 which emits the signal -q- when this derivative is greater for example than six times the maximum value P=314 $I_n$/sec which the derivative of the nominal current may assume, while the discriminator 37 emits a signal -j- if the instantaneous value of this current exceeds for example six times the peak value of the nominal current $I_n$. When the two signals -q- and -j- are applied simultaneously to the inputs of the AND gate 54, a signal -c- which is emitted at the output is transmitted to the AND gate 65 so that a disabling signal -b- is emitted without any delay and fed to the control circuit 30.

Figure 6:
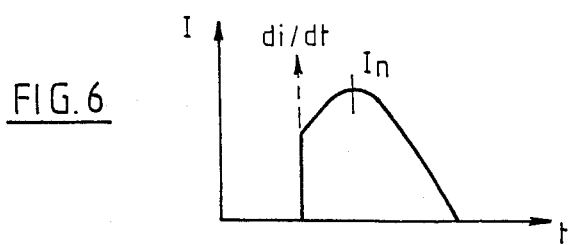
FIG. 6 illustrates the trend which the intensity of the current flowing through a main branch of the switch device may assume when this latter feeds a particular load.

The simultaneous use of the signals -j- and -q- prevents a disabling signal from being emitted when the properties of the load cause the appearance of a starting up current having a very high instantaneous growth without the operating current being abnormal for all that; such a phenomenon occurs for example when a load such as incandescent lamps is supplied with power at a time during a period of the AC current which is not close to the zero cross over, see FIG. 6.

When the control circuit 30 has received a disabling order b, the presence or reappearance of a closure order -f- at the control terminal 35 must not cause the immediate appearance of a conduction signal -e- at the input 32 of the control circuit 30.

An inhibitor circuit such as 34, or a particular internal device of the control circuit 30 provides for example such inhibition.

This inhibitor circuit must moreover include discrimination means or be associated with such means so that said inhibition is, on the one hand, automatically deleted at the end of a certain time interval required for removing the excess heat energy from the load when disabling was caused by one of the first two operating modes and, on the other hand, is maintained when the disabling results from the appearance of a short circuit current whose reappearance would present serious dangers; deletion of this latter inhibition must naturally follow a voluntary intervention of the maintenance staff.

Figure 5:
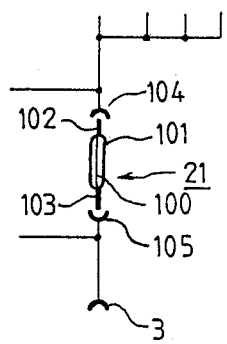
FIG. 5 shows schematically a second type of current detector serving as fuse.

In an advantageous embodiment, the current detector 21 may be formed by a fusible device 100 having a constant and well calibrated ohmic value, see FIG. 5. The circuits detecting and using in this case the image of the current have not been shown.

This fusible wire or ribbon 100, which is disposed in an interchangeable cartridge 100 whose terminals 102, 103 cooperate with terminals 104, 105 of the case 1 of the device, see FIG. 5, may possibly serve for defining the nominal current of the device; the conformation of this cartridge must moreover be such that a fuse of a higher nominal current cannot be associated with the device.

The circuit, which is illustrated in FIG. 1, has been simplified for facilitating understanding thereof. In devices fed with AC current, two head to tail static switches are generally provided for using the two half waves of a current period.

Whereas the construction of branches 7 and 8 of FIG. 1 placed in parallel confers on them an identical operation when currents flow through them in each of the two opposite directions, it is not the same for branch 9 containing the biased element formed by diode 19.

Figure 7:
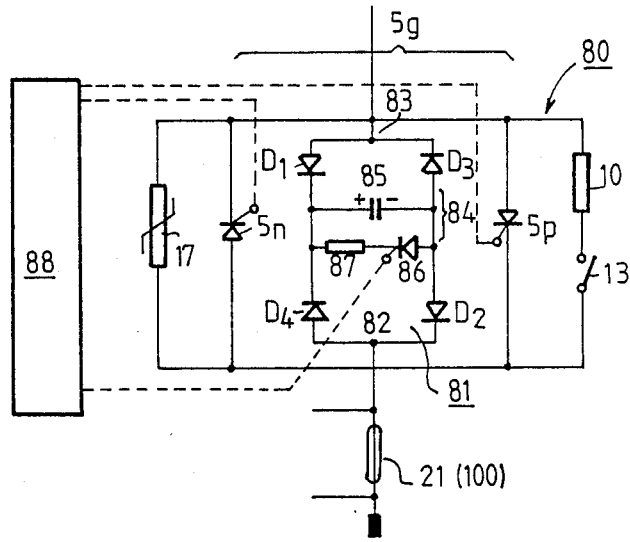
FIG. 7 shows complementary means associated with a switch for making it capable of using the two flow directions of an AC current.

A circuit 80 allowing a common branch 8 to cooperate in the same way with two biased branches each having for its own direction the same function as that of branch 9, is shown in FIG. 7 where, in parallel across two static switches 5p, 5n mounted head to tail, is disposed a GRAETZ bridge 81 equipped with diodes $D_1$ ... $D_4$, whose tops 82, 83, are connected in parallel to the anodes and cathodes, and whose diagonal 84 includes a capacitor 85. This latter may therefore be charged in the same direction by currents flowing in the opposite direction between terminals 2 and 3.

So as to allow successive and complete discharges of this capacitor, which always take place in the same direction the reverse of the preceding one and must be terminated in times very much less than a current half period, a controlled semiconductor 86 is used which is placed in series with a low resistor 87, the whole being placed in parallel across the diagonal 84; this semiconductor is controlled by synchronous signals elaborated incidently from a current reference of the general control circuit 88.

Figure 8:
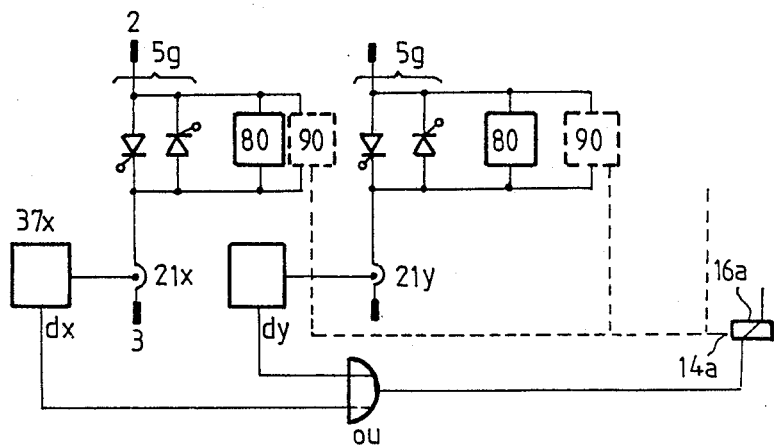
FIG. 8 illustrates schematically the association of groups of switches, associated at each phase with a common electromagnet adapted for performing current transfers.
Figure 9:
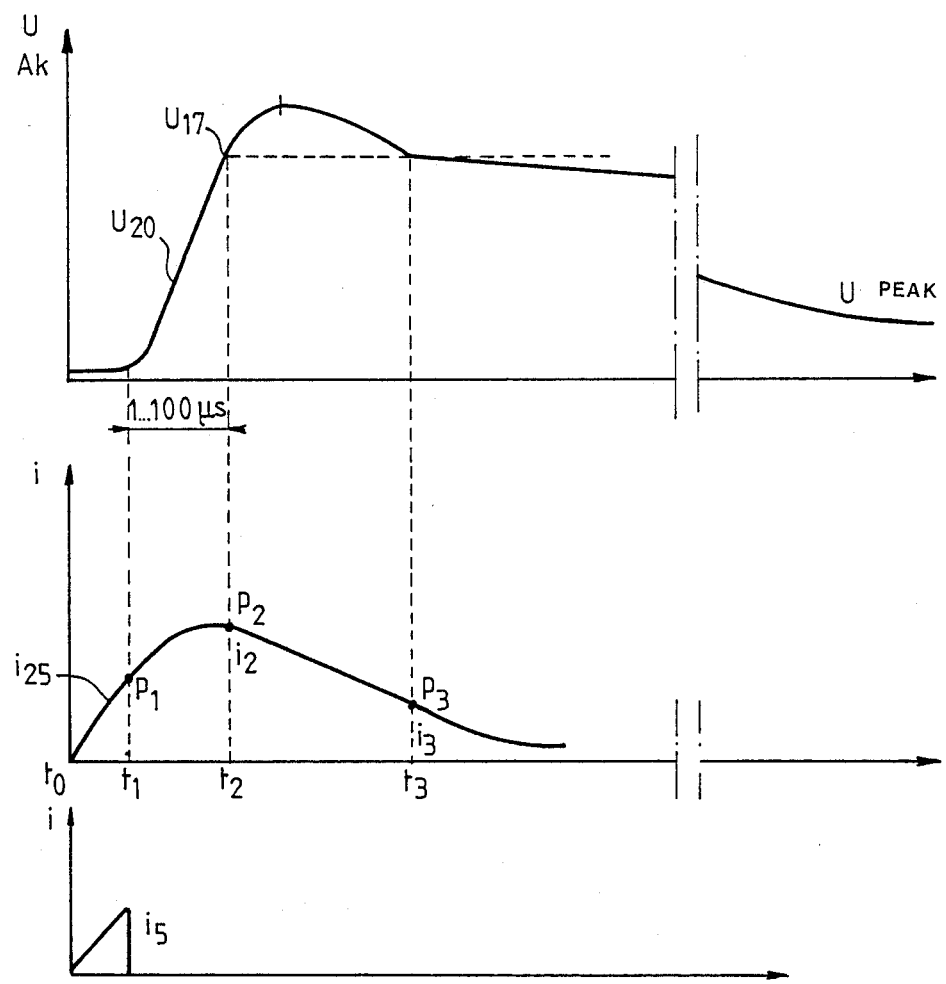
FIG. 9 illustrates a family of curves showing the trend of the voltage and current variations in the circuit.

A device in accordance with the invention and provided for monitoring multiphase AC currents naturally includes as many groups of static switches 5g and associated elements 2 . . . 21 or circuits 80 as there are phases; the circuits 90 shown in FIG. 8 and containing for example branches 7 and 8 may be associated with the armature 14a of a single electromagnet 16a receiving one of the signals $d_x$, $d_y$ emitted by one of the circuits 37x, 37y.

The total volume of the device may thus be reduced by causing the different switches such as 13 to be operated by one and the same electromagnet 16a whose coil receives one of the signals -d-.

If it is desired to protect not only the load, but also the static switches from possible overheating a reverse characteristic will be given for example to two of the circuits 50 particularly adapted to the behaviour of these switches during the passage of currents which are too high.

In the explanation of the operation of the circuit given above it has been assumed, taking into account the rapidity of the phenomena, that the voltage of the network does not substantially vary at a point in its half wave.

When a short circuit current appears of an intensity greater than 6 $I_n$, at time -t0-, signals -j-, -q- or -k-, cause the static switch to be disabled at time -t1-, and branch 7 remains open.

At that time a current for charging the capacity 20 through diode 19 will flow in branch 9 in accordance with the pattern shown from -p1- to -p2- between -t1- and -t2-.

This evolution results from the fact that, on closure of the switch, the inductance L of load 24 plays the role of a current generator, which further increases its intensity following a decreasing slope because of the progressive charge of the capacitor.

This latter sees its voltage $U_{20}$ increase at its terminals until time -t2- when this voltage reaches a value equal to the threshold voltage $U_{17}$ of the voltage limiting resistor; there then takes place a current transfer which flows mainly through this resistor.

During the following procedure, a portion of the energy of the inductance has served for charging the capacitor and the complement is now dissipated in the resistor 17, so that the total current can only decrease. The curve portion -p2p3- restores the trend of this decrease.

When at time -t3- the current reaches a value -i3- corresponding to that which is determined by the bend of the characteristic of resistor 17, the current which diminishes results from the discharge of the capacitor and the voltage drops less rapidly until the time when it reaches a value equal to that of the instantaneous voltage between terminals 2 and 3.

Figure 10:
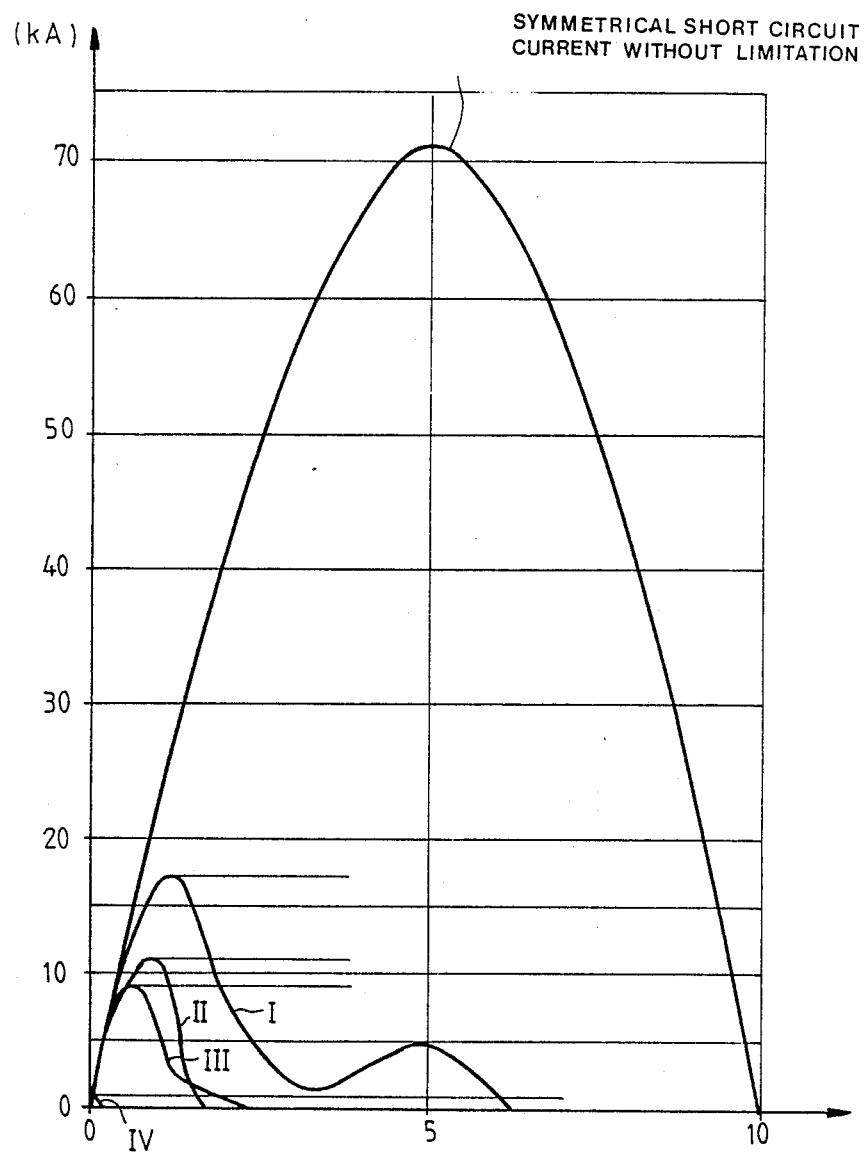
FIG. 10 shows in true size, on the one hand, three limitation curves obtained by three conventional electromechanical devices and, on the other hand, the limitation curve obtained by a static switch circuit of the invention.

The good performances of the switch circuit which has just been described results partially from the choice of a voltage limiting resistor, comprising a zinc oxide based ceramic; although the characteristics of these materials in which the admissible current is estimated at about 1 mA/cm$^2$, do not seem to fit them for circuits protecting against overcurrents, the high level of their threshold voltage as well as their faculty of behaving well during a short energy overload combine in giving a satisfactory result; it is clear that the association of such a voltage limiting means with a static switch implies that this latter must be chosen for withstanding a voltage of the order of 1 KV; thus the line is protected with great efficiency as FIG. 10 shows, in which the curve IV represents the limitation phenomenon of a switch device according to the invention.

Concurrently with this choice, the use of a current limiting resistor including polymers charged for example with carbon so as to make them conducting provides an excellent transfer and current limitation due to the use of the interesting properties of this material, in which the phenomenon of percolation developed during the flow of a high current (and the appearance of which is accidental) causes reversible phenomena to appear.

Figure 4:
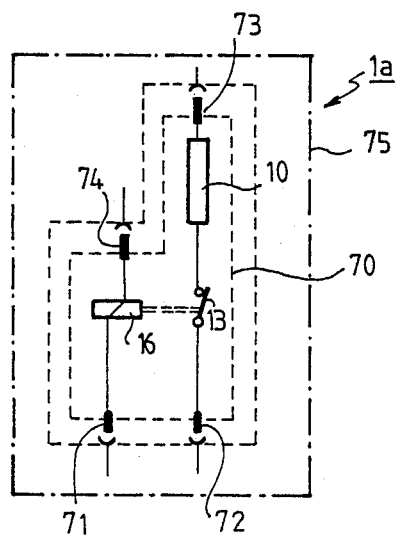
FIG. 4 shows in a partial schematical view a variant of the circuits of FIG. 1 using a removable module containing certain elements of FIG. 1.

In a particular embodiment shown in FIG. 4, the electromagnet 16, switch 13 and resistor 10 could be disposed in a removable subassembly 70 having terminals 71, 72, 73, 74 so as to be able to cooperate with corresponding terminals placed on a case 75 of a switch apparatus $1_a$.

Such a measure may be justified if the apparatus $1_a$ is intended for supplying and protecting a load of a particular kind where an instantaneous overcurrent cannot appear. Considering the conditions in which the opening and closing of switch 13 are carried out, the size of the electromagnet may be appreciably reduced with respect to that which would be required for effecting these operations in the presence of nominal currents and intensities.

The members 76, 77 show symbolically signalling means adapted for informing an operator or the supervision staff about the nature of the faults appearing.

Means 78, 79, 29 illustrate symbolically members for adjusting the circuits which are connected thereto and respectively a member for selecting a particular operating mode.

We claim:

1. An electric switch device having a rated current and comprising between two input and output AC terminals first and second semiconductor components connected head to tail and each having an anode, a cathode and a control electrode, control circuit means connected to the control electrodes and generating switching signals for establishing and interrupting the passage of the current between these terminals respectively when conduction and interruption orders are applied to said control circuit means in normal operation of the switch device; protection input means connected to said control circuit means, for applying thereto disabling orders, and detecting means connected in series between these terminals, said detecting means further being connected to said protection circuit means for actuating said protection means each time an overflow of current is detected by said detecting means, wherein said switch device further comprises a GRAETZ bridge connected in parallel across said anodes and said cathodes, said bridge having first and second branches each comprising two diodes connected head to tail at a junction point and a diagonal branch connecting the respective junction points of the first and second branches and comprising the serial arrangement of resistor means having a high predetermined threshold conduction voltage and withstanding a short high energy overload and of unidirectional conduction means; and a capacitor connected in parallel across said serial arrangement.

2. An electric switch device having a rated current and comprising between two input and output AC terminals a semiconductor component having an anode, a cathode and a control electrode, control circuit means connected to said control electrode and generating switching signals for establishing and interrupting the passage of the current between these terminals respectively when conduction and interruption orders are applied to said control circuit means in normal operation of the switch device; protection input means connected to said control circuit means, for applying thereto disabling orders, and detecting means connected in series between these terminals, said detecting means further being connected to said protection circuit means for actuating said protection means each time an overflow of current is detected by said detecting means, wherein said protection circuit means comprise the serial arrangement of a current limiting resistor withstanding a high overload and a normally open protection switch, said serial arrangement being connected in parallel across said anode and cathode, high speed relay means controlling said protection switch, a first discriminator circuit connected to said detecting means and energizing said relay means for closing the protection switch at each occurence of a current overload of a first type in which the current is substantially comprised between 1.25 and 6 times the rated current; first disabling circuit means for applying a disabling order to said control circuit means each time the duration of said current overload of the first type exceeds a predetermined value; second discriminator circuit means connected to said detecting means and providing a disabling signal at each occurence of a current overload of a second type in which the current gradient is greater than about six times the rated current gradient and second disabling circuit means connecting said second discriminator circuit means to said control circuit means.

3. An electric switch device as claimed in claim 2, wherein said detecting means comprise a calibrated fuse protection device and circuit means deriving from the voltage across said fuse protection device an image of the current through the semiconductor component.

4. An electric switch device as claimed in claim 2, wherein said protection switch includes means for preventing an electro-dynamic repulsion of its mobile contact.

5. An electric switch device as claimed in claim 2, wherein said switch device is housed in a case and said protection switch, said high speed relay means and said current limiting resistor are disposed in a removable module associated with said case.

6. An electric switch device as claimed in claim 2, said device further comprising third discriminator circuit means connected to said detecting means and applying an enabling signal to said second disabling circuit means each time said second type of current overload further has a current intensity higher than about six times the rated current.

7. An electric switch device as claimed in claim 2, said device further comprising fourth discriminator circuit means connected to said detecting means and providing a disabling signal at each occurence of a current overload of a third type in which the current is substantially comprised between the rated current and 1.25 times the rated current, third disabling circuit means connecting said fourth discriminator circuit means to said control circuit means and circuit means applying an enabling signal to said third disabling circuit means each time the duration of said current overload of the third type exceeds a predetermined duration.

8. An electric switch device as claimed in claim 2, said device further comprising further resistor means connected in parallel across said anode and said cathode, said further resistor means having a high predetermined threshold conduction voltage and withstanding a short high energy overload; and further circuit means connected in parallel across said resistors means, said further circuit means comprising serially connected resistor and capacitor and unidirectional conduction means connected in parallel across said resistor and having the same polarity as said semiconductor component.

* * * * *